Feb. 23, 1971 H. R. WALKER 3,566,269

WIDE BAND MICROWAVE MODULATOR

Filed Dec. 28, 1967 2 Sheets-Sheet 1

INVENTOR.
HAROLD R. WALKER
BY
Leonard H. King
ATTORNEY

INVENTOR
HAROLD R. WALKER
BY
Leonard H. King
ATTORNEY

United States Patent Office 3,566,269
Patented Feb. 23, 1971

3,566,269
WIDE BAND MICROWAVE MODULATOR
Harold R. Walker, Metuchen, N.J., assignor to Laser Link Corporation, New York, N.Y.
Filed Dec. 28, 1967, Ser. No. 694,266
Int. Cl. H04b *1/00*
U.S. Cl. 325—48 7 Claims

ABSTRACT OF THE DISCLOSURE

A semiconductor crystal diode is simultaneously part of a subcarrier oscillator tank circuit, and in an R.F. carrier output circuit, such that the R.F. carrier is modulated by the subcarrier.

This invention relates to modulation of microwave signals, and more particularly to wide-band modulation with minimum cross modulation of microwave carriers in the high gigahertz range.

BACKGROUND OF THE INVENTION

Presently used systems for modulating microwave signals, especially in the upper regions of the microwave spectrum, have certain drawbacks. Primarily, the systems now in use are severely limited in bandwidth capacity because the modulation techniques are inherently nonlinear outside of a narrow design band and introduce, for example, harmonic distortion resulting in intolerable cross modulation. Further, these prior art schemes introduce considerable noise at each modulation stage, and since repeater stations are often required in practical microwave systems and present systems require decoding and recoding at each repeater station, the noise components can quickly become severe. In addition, separate, large, modulator packages are often required.

SUMMARY OF THE INVENTION

The method of modulation described in this invention uses a two-stage system to eliminate or significantly reduce the above-described disadvantages. A subcarrier is generated, which has impressed upon it as, for example, a frequency modulation component, one or a number of channels of intelligence, and this modulated subcarrier is used to in turn modulate or chop the carrier frequency. A tuning device having a variable tuning parameter such as a semiconductor crystal, which is made part of the subcarrier tank circuit, is also utilized at some point in the R.F. carrier output circuit, in such a manner that it interrupts the R.F. carrier oscillation or varies the amount of power reaching the load (often an antenna), at the modulated subcarrier rate. This may be accomplished if (a) the crystal is, for example, incorporated in such a manner that it controls the oscillatory state of the R.F. carrier-oscillator, causing it to oscillate or stop oscillation in various portions of the subcarrier cycle; or (b) the crystal is used as a harmonic generator, generating harmonics in certain portions of the subcarrier cycle in which the crystal is in a nonlinear range, but not generating harmonics in other portions in which the crystal is in a linear range; or (c) the crystal is used in the transmission line output circuit of the R.F. carrier-oscillator such that during portions of the subcarrier cycle, it presents a varying mismatch to the carrier-oscillator thereby modulating the carrier power delivered; or (d) the crystal is used as a phase shifter in the output transmission line of the carrier and in this manner achieve carrier modulation. These methods will be described in more detail in connection with the description of the preferred embodiment. Each of these methods, however, offers the advantage of allowing a much larger modulation bandwidth in which the modulation of the carrier is very close to linear, and therefore cross modulation is maintained at tolerably low levels; they offer a simple and convenient way to linearly modulate R.F. signals with a low noise component; they allow modulation entirely external to an R.F. source; they provide compact integral packaging of an oscillator and a subcarrier oscillator and modulator; they allow successive remodulation at repeater stations with no need for the further introduction of nonlinearity and noise introduced by decoding; and they minimize the number of system sources of distortion, nonlinearity and subharmonic generation, reducing these in general to a single item, the phase discriminator, which can now be made quite linear over wide bands using the current state of the art.

A primary object of the present invention is to achieve wide band modulation of a microwave carrier, with negligible cross modulation;

It is another object of the present invention to modulate an R.F. carrier using a solid state oscillator in a simple, convenient, manner and with little introduction of noise;

A third object of the present invention is to allow multiple repeating of microwave signals without the need for decoding and recoding at each repeater station;

Still another object of the present invention is to provide a wide band linear modulator integral with a compact, solid state, microwave oscillator or harmonic generator.

These and other features, objects and advantages of the invention will, in part, be pointed out with particularity and will, in part, become obvious from the following more detailed description of the invention taken in conjunction with the accompanying drawings which forms an integral part thereof.

BRIEF DESCRIPTION OF THE DRAWING

In the various figures of the drawing like reference characters designate like parts.

In the drawings.

DESCRIPTION OF THE PREFERRED EMBODIMENT

Figures 1, 2, 3, 4:
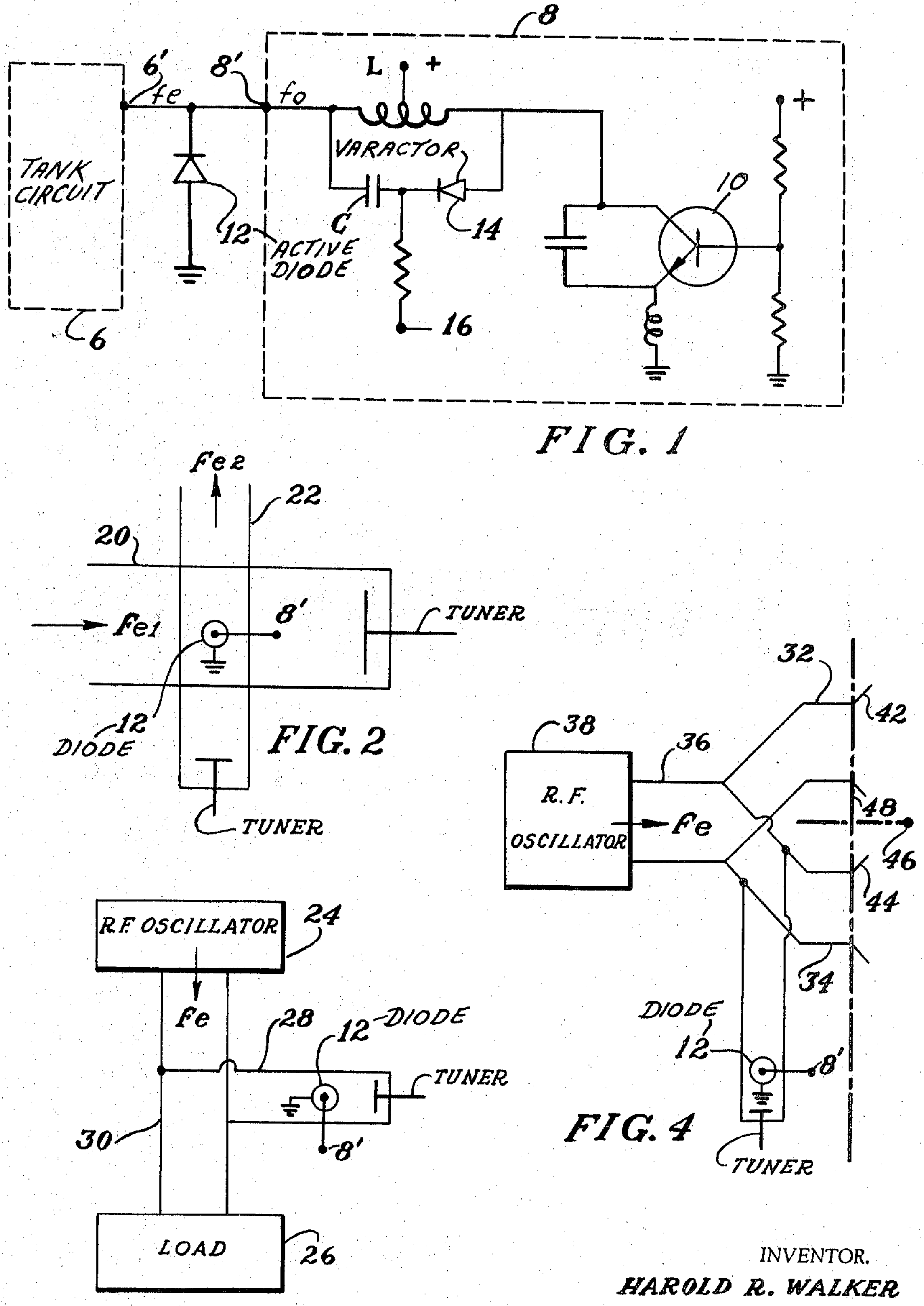
FIG. 1 is a schematic diagram of the basic circuit of this invention assuming lumped constants to be used throughout, and shown modulating an R.F. oscillator.
FIG. 2 is a schematic view of a circuit of this invention used to modulate harmonics of the R.F. frequency.
FIG. 3 is a schematic diagram of a circuit of this invention in which variable impedance is used to modulate the R.F. carrier.
FIG. 4 is a schematic diagram of a circuit of this invention in which variable phase shift is utilized to tilt an antenna beam to achieve modulation.

Referring to FIG. 1, there is shown a schematic diagram utilizing lumped components to form the basic oscillator circuit 8 of this invention. It should be noted that it is unnecessary to use lumped circuits throughout, but part or all of the oscillator may utilize wave guides, coaxial circuits or strip line forms, for example. There is shown an oscillator circuit 8 utilizing transistor 10, varactor 14 and other inductances L and capacitance C to form an oscillator of subcarrier frequency $f_0$ which is arranged so that it can be modulated in frequency by signal-carrying intelligence at 16. In a typical modulation system the intelligence signal may comprise a single video signal or a plurality of combined video signals; $f_0$, the subcarrier frequency, is some frequency considerably below $f_e$, the microwave or R.F. carrier frequency produced by an R.F. oscillator 6.

Referring again to FIG. 1, a diode 12 of the active type, such as a Gunn or LSA diode, for example, is connected to oscillator 8 at a point 8′ and to the frequency determining or tank circuit of oscillator 6 at a point 6′. Diode 12, as is well known in the art, acts as an oscillation device when reverse biased, and as a conductor when forward biased, and may be assumed to be part of the tank circuit, not only of the oscillator 8 through the connection at point 8′ as described, but also of the tank circuit 6 (through connection at point 6′) to determine the R.F. carrier $f_e$. Therefore, in this embodiment, this diode 12 is a component in two oscillator tank circuits of different frequencies, $f_o$ and $f_e$. The circuit is so arranged that during part of the cycle of oscillator 8, the bias on diode 12 is such as to allow diode 12 and tank circuit 6 to oscillate at frequency $f_e$, while for other parts the cycle of oscillator 8, the bias on crystal diode 12 is such that diode 12 and tank circuit 6 will not oscillate, the result being an R.F. signal, at carrier frequency $f_e$, which is modulated or chopped at the rate of frequency $f_o$. In this manner, since frequency $f_o$ is in turn modulated with the intelligence-carrying signal which it is desired to transmit, the resulting microwave output is an R.F. frequency $f_e$, pulse modulated at an $f_o$ rate, and, in general, frequency-modulated with one or more video signals. In this manner, there is achieved in a very simple, compact, integral package, a modulation technique for an R.F. oscillator producing an R.F. signal at a frequency $f_e$ (which may, for example, be a solid state oscillator in the high gigahertz range) which allows large percentages of modulation with high modulation linearity and negligible cross modulation.

Referring now to FIG. 2, there is shown another embodiment of the invention in which a wave guide 20 carries a signal at a frequency $f_{e1}$, and, cross coupled to it, a smaller wave guide 22 desiged to carry a higher frequency, for example, $f_{e2}$, which may be the fourth harmonic of $f_{e1}$. Assuming the crystal diode 12 is a diode-type varactor mounted in this multiplier cavity and connected at point 8′ to oscillator 8, the frequency $f_{e1}$ is normally multiplied by the diode to harmonics including $f_{e2}$, which leaves by the smaller wave guide 22 which is designed for that freqency. To function effectively, crystal diode 12 must be located in such a way that, with associated waveguide cavities, it forms a part of the tuned circuit operating two different frequencies, and crystal diode 12 must be biased to be operating in a nonlinear region in order to generate harmonics at all. Harmonic multipliers of this type are well known to those skilled in the art and are commercially available. The subcarrier oscillator, $f_o$, is arranged to vary this bias from linear to nonlinear at $f_o$, a much lower frequency than $f_{e1}$, so that the harmonic signal $f_{e2}$ is pulse-modulated at the rate $f_o$ introduced by the oscillator and its varactor circuitry. In this manner, while the R.F. signal $f_{e1}$ is not modulated, the utilized R.F. output $f_{o2}$ is pulse modulated at the $f_o$ rate, as desired.

Referring now to FIG. 3, a still different method of utilizing the diode 12 connected at point 8′ to oscillator 8 to modulate or chop the R.F. carrier $f_e$ at the subcarrier rate $f_o$, is demonstrated. A crystal diode 12 is placed in a parallel branch of the transmission line connecting the R.F. carrier oscillator 24 of frequency $f_e$, to its output load 26 which may be an antenna. The diode 12 and the branch circuit 28 are so designed that during a portion of the cycle of $f_o$, a very low impedance is placed across the main transmission line 30 and during other portions of the cycle of $f_o$ a much higher impedance is placed across the transmission line 30. In this way, the VSWR looking from the oscillator 24 toward the load 26, can be made very close to a match during portions of the $f_o$ cycle, and mismatched during other portions, causing a large percentage of modulation of the carrier $f_e$ at the output load 26, this modulation occurring at the subcarrier rate $f_o$. This method therefore accomplishes the same result as the first two methods described, without the need in this case to directly affect the R.F. oscillator, or the harmonic generation.

Referring now to FIG. 4, there is shown a still different means of achieving an effective modulation of the carrier $f_e$ at the distant receiving point 46, which modulation of $f_e$ is the ultimate object in all cases. Here, the output of oscillator 38 at R.F. carrier frequency $f_e$ is branched equally to antennas 42 and 44 via a branch line 32. However, in another branch line 34 a parallel line 40 is inserted containing crystal diode 12 connected at 8′ to circuit 8, which is utilized in the oscillator circuit of $f_o$ as described above. During part of the cycle of $f_o$ this crystal diode introduces negligible phase shift into line 34 compared to line 32 and the antenna beam points normal to the line 48 connecting the two antenna phase centers, and intersects distant point 46. During another portion of the cycle $f_o$, considerable relative phase shift is introduced, and the beam tilts resulting in a very large reduction in the signal received at the distant antenna location 46, causing an effective amplitude modulation or chopping of $f_e$ at close to 100% at the $f_o$ rate, as required.

Figure 5:
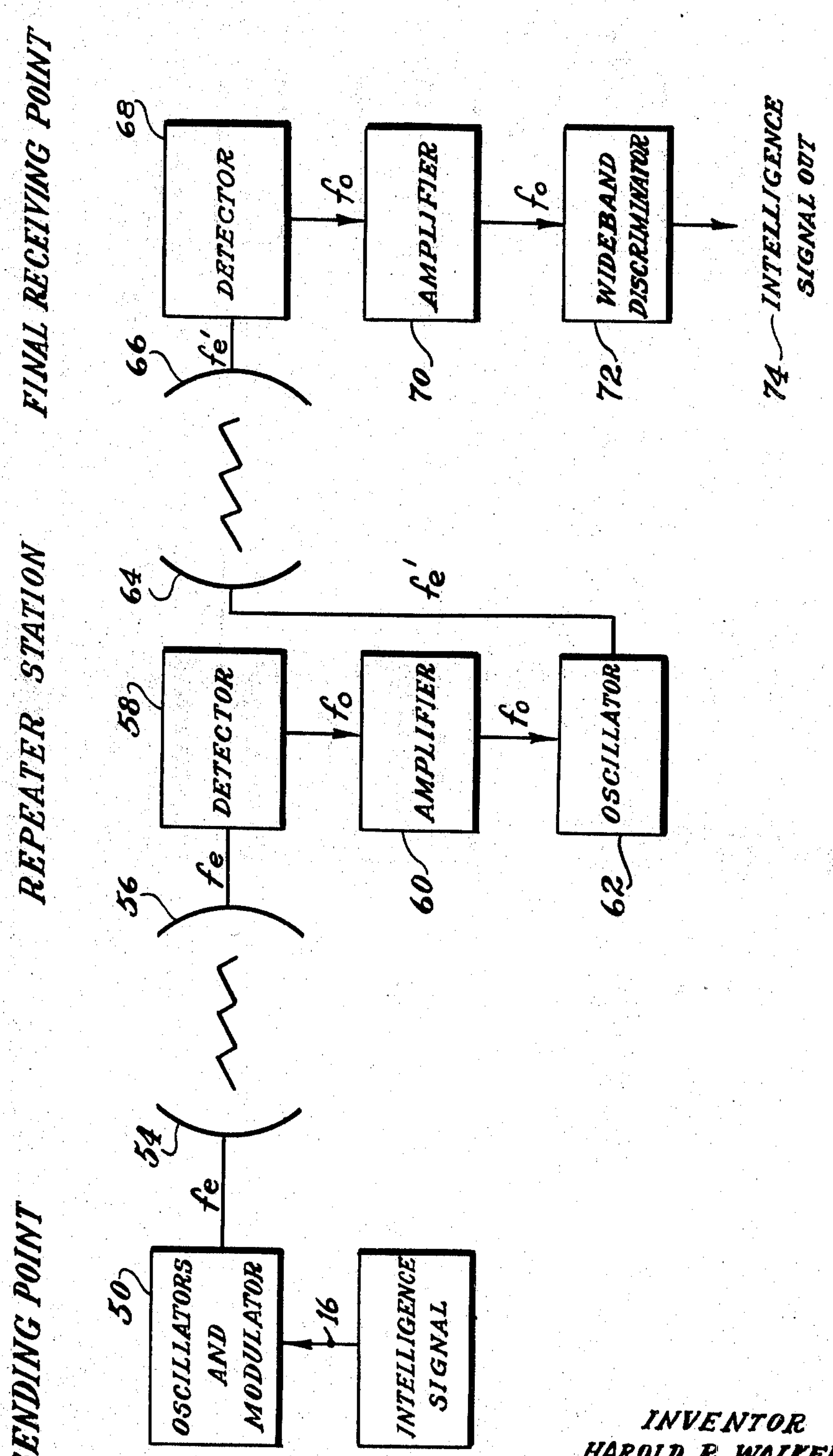
FIG. 5 is a block diagram of a complete communication system using the modulation methods of this invention.

Referring now to FIG. 5, there is depicted a complete system for modulation, transmission to a distant location, and detection, using the modulation means of this invention. The carrier and subcarrier oscillators 50, driven at point 16 by intelligence-carrying signal (e.g., video signal), feeds as a load antenna 54. The signal is received, e.g., at repeater antenna 56, enters detector 58, leaves at the subcarrier frequency $f_o$ into amplifier 60 and is used to remodulate oscillator 62 at $f_e$ or a new carrier $f_e'$, without complete decoding being required prior to entry into antenna 64. At the final receiving antenna 66, the carrier is again detected at 68 and $f_o$ amplified at 70, but the signal enters a wideband discriminator 72 which may e.g., be of the coaxial type, to remove the subcarrier and provide the original intelligence-carrying signal 74. In this manner, successive amplification is accomplished with little introduction of noise or nonlinearity.

There has been disclosed heretofore the best embodiment of the invention presently contemplated and it is to be understood that various changes and modifications may be made by those skilled in the art without departing from the spirit of the invention.

What I claim as new and desire to secure by Letters Patent is:

1. A system for modulating a carrier signal of a frequency $f_e$ at frequency $f_o$ which is less than $f_e$ comprising a first oscillator for generating a control signal at frequency $f_o$, and a second oscillator for generating a carrier signal at frequency $f_e$, said first oscillator having a first frequency-determining circuit, and means coupled to said first frequency-determining circuit for ferquency modulating said control signal with an intelligence-carrying signal, said second oscillator including a second frequency-determining circuit, and an active semiconductor diode coupled to said first oscillator and to said second frequency determining circuit and operable in response to the output of said first oscillator to amplitude-modulate the output signal of said second oscillator at the rate of said control signal.

2. The system of claim 1, wherein said semiconductor diode is operable in response to said control signal in one of two states such that oscillation of said second oscillator occurs only during certain portions of each cycle of said control signal.

3. The system of claim 2, further comprising a waveguide circuit operative at a frequency $f_e$ and at a selected harmonic of frequency $f_e$, said diode being utilized in said waveguide circuit and biased by the signal of frequency $f_o$ such that during one part of the cycle of said control signal said diode is operating in a linear range, and during another part of the cycle of said control signal it is operating in a nonlinear range, thereby resulting in an output which is the said harmonic of $f_e$ amplitude modulated at the rate of frequency $f_o$.

4. The system of claim 1, wherein said diode is connected to the output transmission line circuit of said second oscillator such that during selected portions of the cycle of said control signal, it presents a high impedance across said second frequency-determining circuit and during other portions of the cycle of said control signal, it presents a low imepdance across the output of said second frequency-determining circuit.

5. The system of claim 2, further comprising a pair of antennas and a two-branch transmission line T connecting said two antennas to said output, said diode being connected across one said branch in such manner that during one part of the cycle of said control signal $f_o$, no phase shift is introduced into said one branch by said diode, and during another part of the cycle of said control signal $f_o$, a relatively large phase shift is introduced into said one branch, thereby causing the radiating antenna beam to tilt during part of the cycle of said control signal $f_o$, resulting in a modulation of the signal transmitted in any one direction away from said antennas.

6. A communication system between distant points, comprising:

(a) the system of claim 1, in which the load is a transmitting antenna which radiates said modulated output signal; and (b) a system for receiving and detecting the output signal, comprising in sequential connection: a receiving antenna, an R.F. detector for removing the carrier frequency $f_e$, an amplifier operating at the frequency $f_o$, and a wide band discriminator for removing the frequency $f_e$ and deriving said intelligence-carrying signal.

7. The communication system of claim 6, further comprising a repeater station interposed between said transmitting antenna and said receiving antenna, said repeater station comprising, in sequence: a receiving antenna, an R.F. detector for removing the carrier frequency $f_e$, an amplifier operating at the frequency $f_o$, an oscillator of the carrier frequency $f_e$, said amplifier output modulating said carrier frequency $f_{e1}$, and a transmitting antenna.

References Cited

UNITED STATES PATENTS

| | | | |
|---|---|---|---|
| 2,405,765 | 8/1946 | Smith | 325—11 |
| 2,704,362 | 3/1955 | Bergan | 325—9X |
| 3,235,817 | 2/1966 | Stapelfeldt | 325—105X |
| 3,354,396 | 11/1967 | Whittaker et al. | 325—105X |
| 3,378,769 | 4/1968 | Lazzatto | 325—11 |
| 3,383,597 | 5/1968 | Battail et al. | 325—3X |

ROBERT L. GRIFFIN, Primary Examiner

R. S. BELL, Assistant Examiner

U.S. Cl. X.R.

325—3; 331—107; 332—10